United States Patent
Djordjevic et al.

(10) Patent No.: US 8,219,874 B2
(45) Date of Patent: Jul. 10, 2012

(54) MULTI-DIMENSIONAL LDPC CODED MODULATION FOR HIGH-SPEED OPTICAL TRANSMISSION SYSTEMS

(75) Inventors: Ivan B. Djordjevic, Tucson, AZ (US); Hussam G. Batshon, Tucson, AZ (US); Lei Xu, Princeton Junction, NJ (US); Ting Wang, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 435 days.

(21) Appl. No.: 12/535,423

(22) Filed: Aug. 4, 2009

(65) Prior Publication Data

US 2010/0211849 A1  Aug. 19, 2010

Related U.S. Application Data

(60) Provisional application No. 61/153,726, filed on Feb. 19, 2009.

(51) Int. Cl.
*H03M 13/00* (2006.01)
*G06F 11/00* (2006.01)
(52) U.S. Cl. ........................................ 714/755; 714/800
(58) Field of Classification Search .................. None
See application file for complete search history.

(56) References Cited

U.S. PATENT DOCUMENTS

| 2004/0258177 A1* | 12/2004 | Shen et al. ............... 375/308 |
| 2008/0163025 A1* | 7/2008 | Djordjevic et al. .......... 714/755 |
| 2009/0225878 A1* | 9/2009 | Papadopoulos et al. ...... 375/260 |
| 2009/0285323 A1* | 11/2009 | Sundberg et al. ............. 375/267 |
| 2010/0107032 A1* | 4/2010 | Eroz et al. ................... 714/752 |

OTHER PUBLICATIONS

Djordjevic, I., et al. Using LDPC-Coded Modulation and Coherent Detection for Ultra Highspeed Optical Transmission. Journal of Lightwave Technology. vol. 25, No. 11. Nov. 2007. pp. 3619-3625. http://www.ece.arizona.edu/~van/JLT_Nov_07.pdf.

Djordjevic, I., et al. Low-Density Parity-Check Codes for 40 GB/S Optical Transmission Systems. IEEE Journal of Selected Topics in Quantum Electronics. vol. 12, No. 4, Jul./Aug. 2006. pp. 555-562. http://www.ece.arizona.edu/~ivan/JSTQE_July_Aug_2006.pdf.

* cited by examiner

*Primary Examiner* — Guerrier Merant
(74) *Attorney, Agent, or Firm* — James Bitetto; Joseph Kolodka; Bao Tran

(57) ABSTRACT

Arbitrarily high data transmission rates may be achieved by the use of N-dimensional, LDPC-coded modulation. N orthonormal basis functions are employed using coherent reception, resulting in a proportional increase in transmission rate with only a modest increase in bit-error ratio.

13 Claims, 6 Drawing Sheets

MULTI-DIMENSIONAL LDPC CODED MODULATION FOR HIGH-SPEED OPTICAL TRANSMISSION SYSTEMS

RELATED APPLICATION INFORMATION

This application claims priority to provisional application Ser. No. 61/153,726 filed on Feb. 19, 2009, incorporated herein by reference.

BACKGROUND

1. Technical Field

The present invention relates to modulation techniques for optical transmission systems, and more particularly to multi-dimensional modulation techniques which take advantage of low density parity check coding.

2. Description of the Related Art

In recent years, optical communication systems have been evolving rapidly to adapt to the continuous increase in telecommunication needs. One major respect in which optical systems must improve is represented by the continuously increasing demand on transmission capacity. Such a demand stems mainly from the growing popularity of multimedia in everyday life. Unfortunately, adapting to higher transmission rates brings with it various obstacles, such as degradation in the signal quality as well as increased costs. Signal degradation is a result of linear and non-linear effects such as polarization mode dispersion and intrachannel nonlinearities. Non-linear effects become more pronounced at higher symbol rates.

Consequently, new optical communications solutions have to offer affordable upgrades to currently available optical communication systems that operate at lower speeds to satisfy the demand for higher speeds. This presents a dual benefit concept for approaching this problem: Utilizing currently available components avoids the added cost of producing faster, more complex components and avoids at the same time the augmented degradation of performance that accompanies higher speed components that results from the increase in non-linear effects.

SUMMARY

The present principles are drawn to optical transmissions systems and methods. According to one aspect of the present principles, a transmitter for optical transmissions is provided. The transmitter includes at least one low density parity check (LDPC) encoder configured to encode source data, an interleaver configured to interleave the encoded data, a mapper configured to generate N coordinates in accordance with an N-dimensional (N-D) signal constellation, and a modulator configured to perform electrical-to-optical conversion in accordance with each of the N coordinates to provide a transmission signal, where the N coordinates are defined by a set of N orthonormal basis functions.

According to another aspect of the present invention, a coherent receiver for optical transmissions is shown, including a demodulator configured to receive an input signal made up of N component signals (where each component signal is modulated according to one of N orthonormal basis functions) and configured to output N branches corresponding to the N signals, a demapper configured to receive the N branches and iteratively demap the N branches based on extrinsic LLRs, a bit log likelihood ratio (LLR) calculator configured to compute LLRs for bit prediction, and at least one LDPC decoder configured to iteratively decode bits by feeding back extrinsic LLRs to the demapper.

According to another aspect of the present invention, a method for N-dimensional modulation is shown, including the encoding a signal with a low-density parity check (LDPC) code, interleaving data from a plurality of encoders to a mapper for mapping an encoded signal, mapping the encoded signal to N constellation coefficients, defined by a set of N orthonormal basis functions, using an N-dimensional constellation, and performing a modulation in accordance with the N constellation coefficients to provide a transmission signal. The method goes on to coherently receive the transmission signal, demodulate the transmission signal into N branches corresponding to the N orthonormal basis functions, iteratively demap the transmission signal from the N branches using an N-dimensional signal constellation, predict bits using LLRs for demapped bits, and iteratively decode the signal using at least one LDPC decoder configured to iteratively decode bits by feeding back extrinsic LLRs for demapping.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
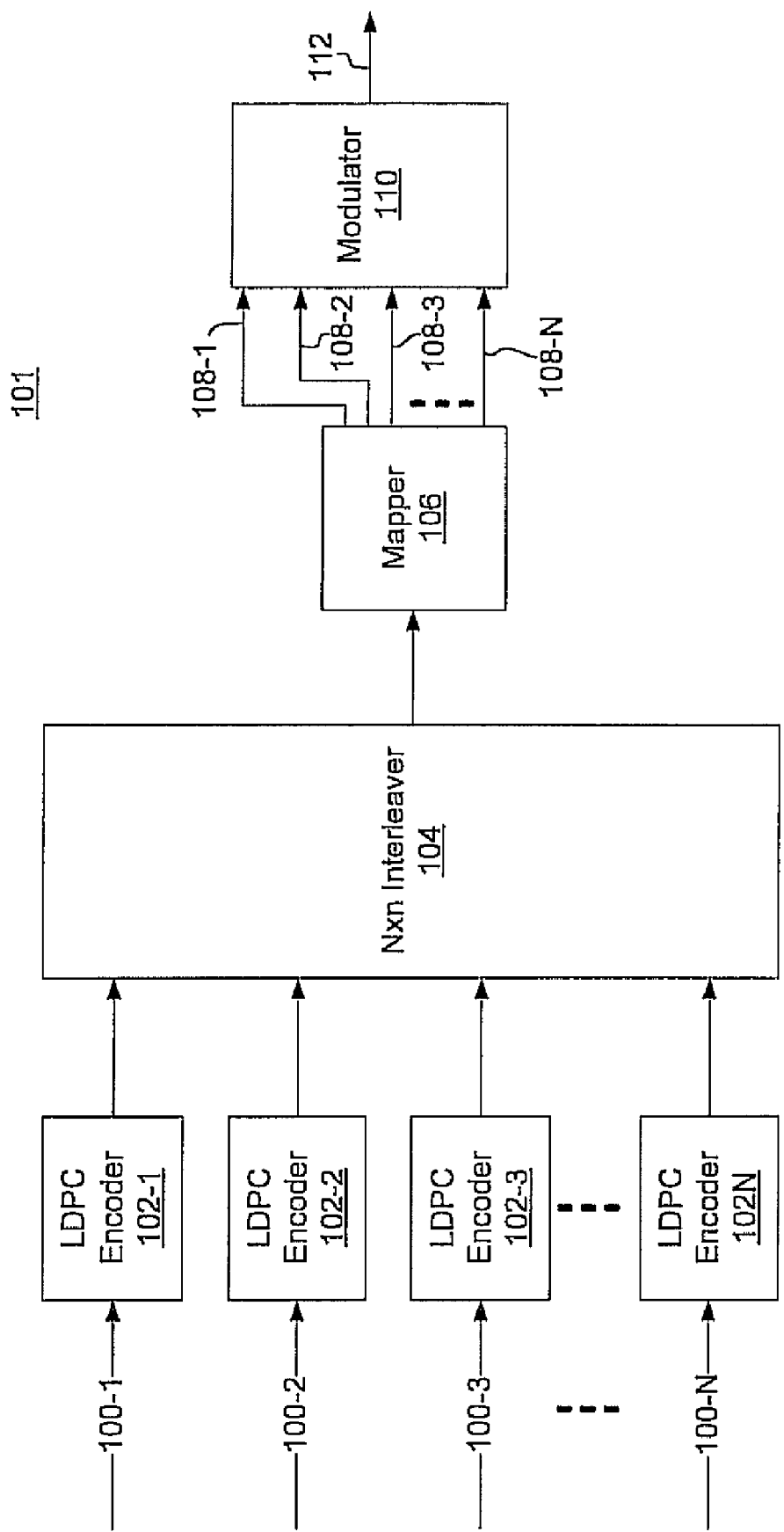
FIG. 1 shows a block diagram of an exemplary embodiment of an N-dimensional, low-density parity check (LDPC) coded transmitter.

According to the present principles, a multi-dimensional low-density parity check (LDPC) coded modulation (N-D-LDPC-CM) scheme enables high aggregate data transmission rates that can go up to 400 Gb/s and beyond using current, commercially available components operating at 40 Giga Symbols/s. Rather than developing new equipment which is capable of transmitting at a higher rate, the present principles show a technique for multiplying the transmission rate by transmitting according to a plurality of orthonormal basis functions. The multi-dimensional scheme can achieve N·40 Gb/s aggregate rates where N∈{1, 2, ... } represents the total number of dimensions involved in the scheme. Such rates can be used in high-speed optical transmission systems.

In such a scheme, each dimension is represented by a separate orthonormal basis function. For instance, if a rate of 200 Gb/s is desired, five orthonormal basis functions could be used. For example, these functions might be phase (in-phase and quadrature each comprising a separate function), polarization, time (based on pulse positioning modulation), and frequency.

Increasing the number of dimensions (i.e., the number of orthonormal basis functions), increases the aggregate rate of the system, while LDPC coding grants more reliable transmission at these higher speeds. The structured LDPC codes used in this scheme improve performance by allowing easier iterative exchange of the extrinsic soft bit-reliabilities between an a posteriori probability (APP) demapper and an LDPC decoder. Using a quasi-cyclic structure for the corresponding parity-check matrices of the LDPC code can simplify the decoder hardware implementation and, moreover, provide additional simplifications to the memory addressing. Using this technique, it is possible to reach over 400 Gb/s aggregate rate, while providing 10.75 dB coding gain at bit error ratio (BER) of $10^{-12}$.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device). The medium may include a computer-readable medium such as a semiconductor or solid state memory, magnetic tape, a removable computer diskette, a random access memory (RAM), a read-only memory (ROM), a rigid magnetic disk and an optical disk, etc.

Referring now in detail to the figures in which like numerals represent the same or similar elements and initially to FIG. 1, an exemplary transmitter 101 according to the present principles is shown. N input signals, 100-1 through 100-N, representing N different bit streams from different information sources, pass through LDPC encoders 102-1 through 102-N. Each encoder 102 is characterized by LDPC(n,k,r), where n represents the codeword length, k represents the number of information bits, and r represents the code rate r=k/n.

The code girth is the shortest cycle in the Tanner graph representation of the LDPC code. Shorter cycles in the Tanner graph involve greater computational effort in the decoding algorithm and slow the algorithm down or sometimes prevent it completely from converging to the optimal decoding result. On the other hand, larger girth relates to a larger minimum distance of the code. A lower bound on the minimum distance increases exponentially with the girth of the code. Hence, higher girth codes are preferable. Even-numbered girths are possible, with girths of six or below producing codes which are relatively weak. According to one embodiment, the encoders 102 may employ LDPC codes having a girth of eight. In other embodiments, the girth may be ten or greater.

The outputs of the encoders 102 are interleaved by the N×n bit interleaver 104 into a single bit stream. The bit interleaver 104 receives data from the encoders row-wise and outputs the data column-wise to the mapper 106 that accepts N bits at time instance i. The mapper determines the corresponding M-ary ($M=2^N$) signal constellation point:

$$s_i = \frac{1}{\sqrt{N}} \sum_{j=1}^{N} \phi_{i,j} \Phi_j(t). \tag{1}$$

Figure 6:
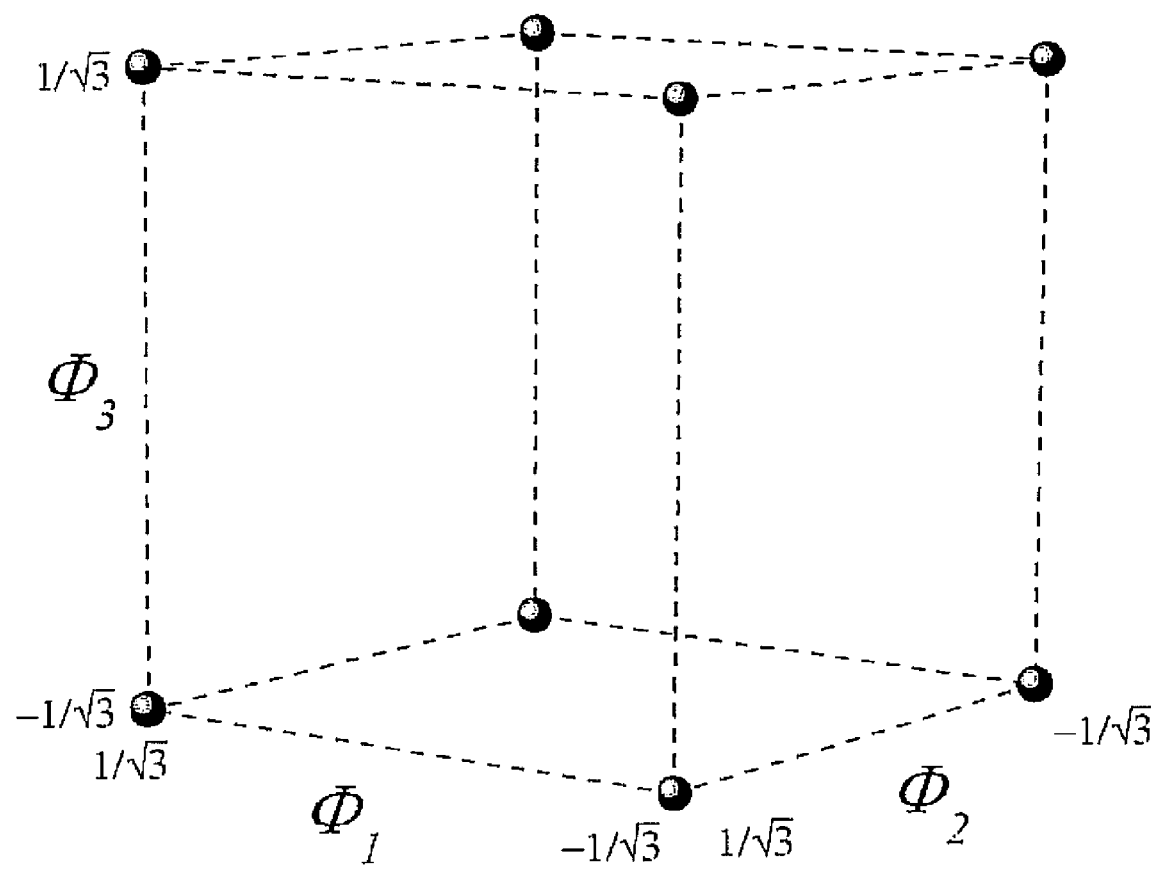
FIG. 6 is a visual depiction of an B-point signal constellation being represented as the vertices of a 3-dimensional hypercube.

The set $\{\Phi_1(t), \Phi_2(t), \Phi_3(t), \ldots, \Phi_N(t)\}$ is a set of N orthonormal basis functions, and $\phi_{i,j} \in \{1,-1\}$ represents the possible values of the signal for each basis function. Thus, the mapper 106 assigns a constellation symbol for the time i by assigning a value of ±1 to each of the orthonormal functions. This places the N signals at a distance of unity from the origin, thereby forming the vertices of an N-dimensional hypercube. An example where N=3 is shown in FIG. 6. These values 108-1 through 108-N are then sent to the modulator 110 to be modulated into a single signal and sent over an optical fiber 112.

As defined above, $\phi_{i,j} \in \{1,-1\}$ limits the number of possible values for each component to two. However, including more than two possible values increases the total transmission rate at the expense of some degradation in performance. For example, the orthonormal frequency component can use FSK with multiple frequencies to achieve higher final data transmission rates while decreasing the spectral efficiency of the system. Despite having a broad range of possible values, the frequency component would nonetheless represent a single basis function.

Figure 2:
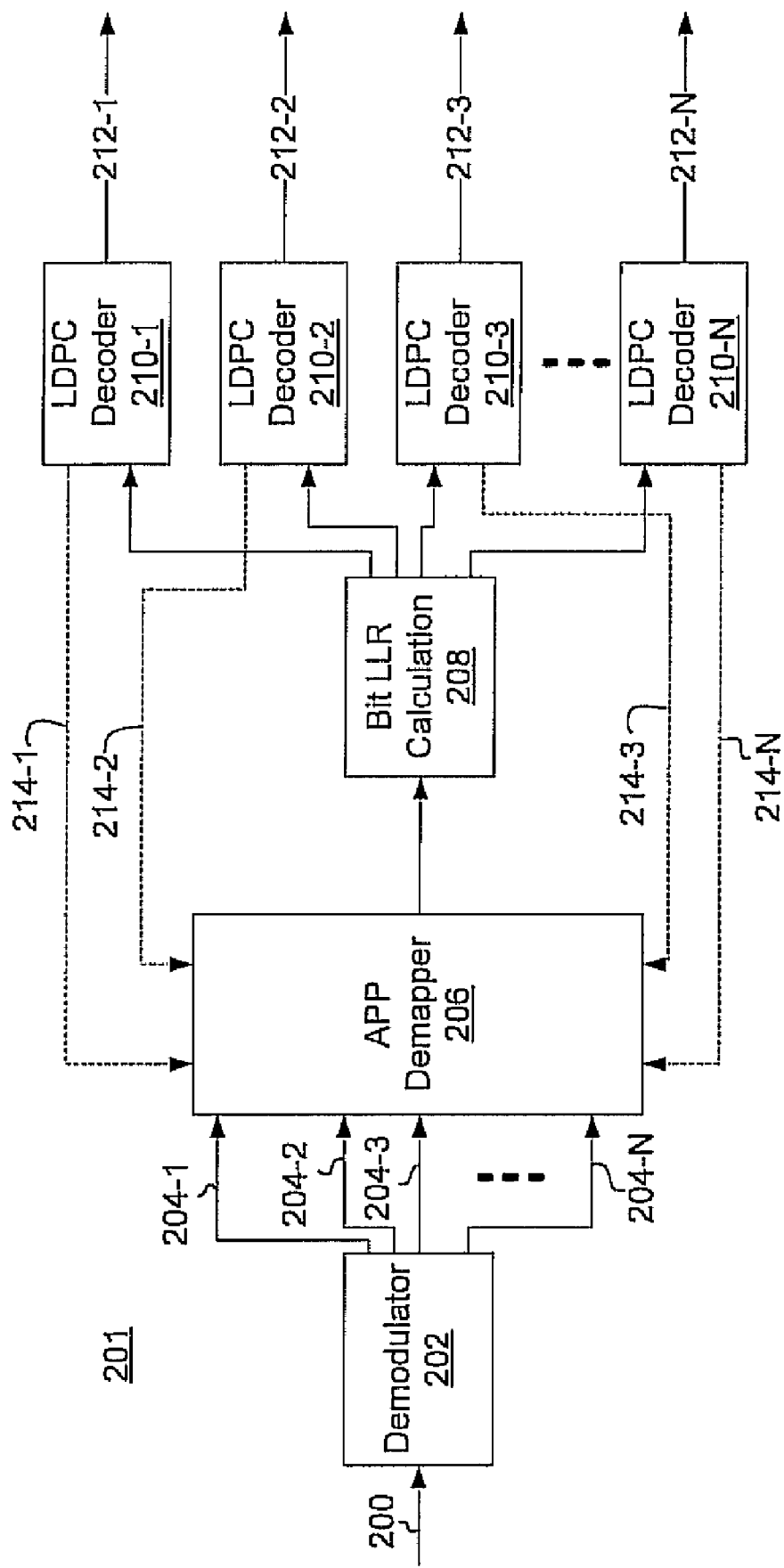
FIG. 2 shows a block diagram of an exemplary embodiment of an N-dimensional, LDPC-coded receiver.

FIG. 2 shows an exemplary coherent receiver 201 according to the present principles. N-D-LDPC-CM signal 200 arrives at the demodulator 202, which splits the signal into N components 204-1 through 204-N representing the N orthonormal basis functions. These N branches 204 are then sampled at the symbol rate and the corresponding samples are forwarded to the a posteriori probability (APP) demapper 206.

The APP demapper 206 provides the symbol log-likelihood ratios (LLRs) for iterative LDPC decoding. The symbol LLRs may be computed in the APP demapper 206 as:

$$\lambda(s_i) = \log \frac{P(s_i = s_0 \mid r_i)}{P(s_i \neq s_0 \mid r_i)}, \tag{2}$$

where $P(s_i|r_i)$ is determined by Bayes' rule as:

$$P(s_i \mid r_i) = \frac{P(r_i \mid s_i) P(s_i)}{\sum_{s_i'} P(r_i \mid s_i') P(s_i')}, \tag{3}$$

$s_i=(\phi_{i,1}, \phi_{i,2}, \phi_{i,3}, \ldots, \phi_{i,N})$ denotes the transmitted signal constellation point, $r_i=(r_{i,1}, r_{i,2}, r_{i,3}, \ldots, r_{i,N})$ denotes the received constellation point (e.g., the samples at the APP demapper input), $P(r_i|s_i)$ denotes conditional probability estimated from histograms, and $s_0$ denotes the referent constellation point. The probability $P(s_i=s_0|r_i)$ represents the probability that the symbol at instant i is equal to the referent constellation point. The bit LLRs for LDPC decoding are then calculated in the Bit LLR Calculation block 208 before being passed on to LDPC decoders 210-1 through 210-N.

The LDPC decoders 210 forward extrinsic LLRs to the APP demapper 206, and extrinsic information is iterated back and forth until convergence or until a predefined number of iterations is reached. The extrinsic information at the input represents an a priori probability to be used in the decoding step. Each decoder interprets the extrinsic information as an approximation of the LLR of the a priori probabilities. These iterations between the LDPC decoders 210 and the APP demapper 206 are referred to as outer iterations, in contrast to the inner iterations that take place within the LDPC decoders 210. The outer iterations help in improving the bit error ratio (BER) performance, without compromising the complexity of the system. Extrinsic information transfer (EXIT) chart analysis is used to select suitable LDPC codes for use in this coded-modulation scheme. EXIT charts are used to optimally match an LDPC decoding of a quasi-cyclic LDPC code with the APP demapper. Upon decoding, the LDPC decoders 210 produce outputs 212-1 through 212-N, representing the successfully transmitted bit streams.

The receiver operates purely coherently. This addresses a problem in the prior art, wherein hybrid receivers could not efficiently use low-order constellations. This arose as a result of the fact that direct detection was limited to positive signals, greatly diminishing the efficiency of low-order schemes and increasing the power requirements for high-order schemes. Pure coherent detection permits efficient use of low-order constellations, and decreases power consumption relative to an equivalent number of constellation points in direct or hybrid detection schemes.

Figure 3:
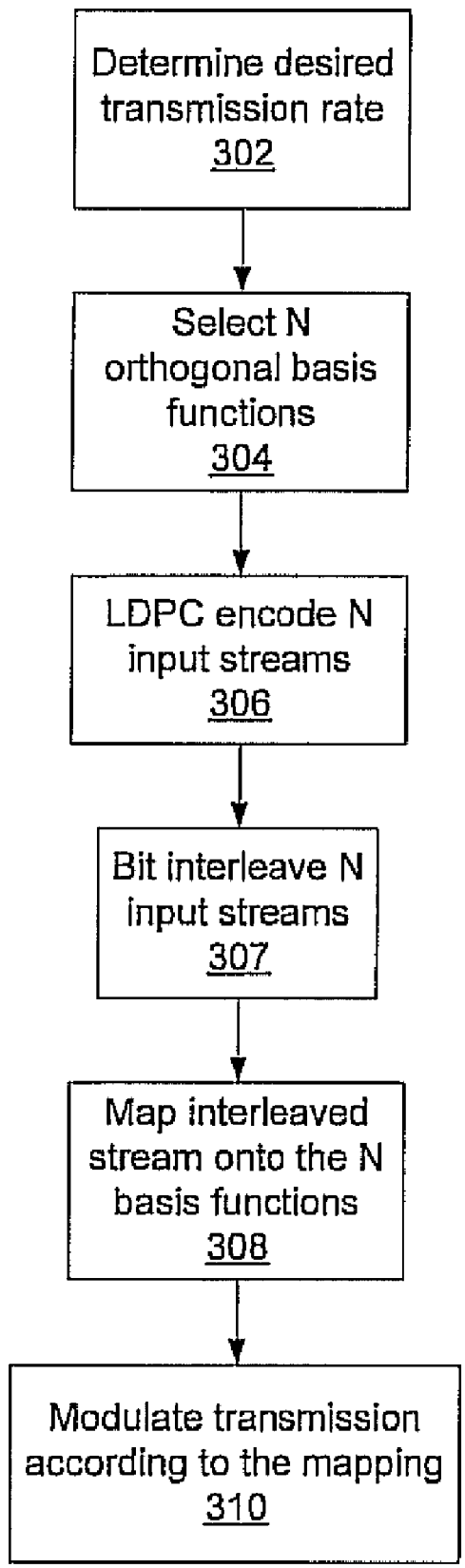
FIG. 3 shows a block/flow diagram of an exemplary method for transmitting N-dimensional, LDPC-coded signals.
Figure 4:
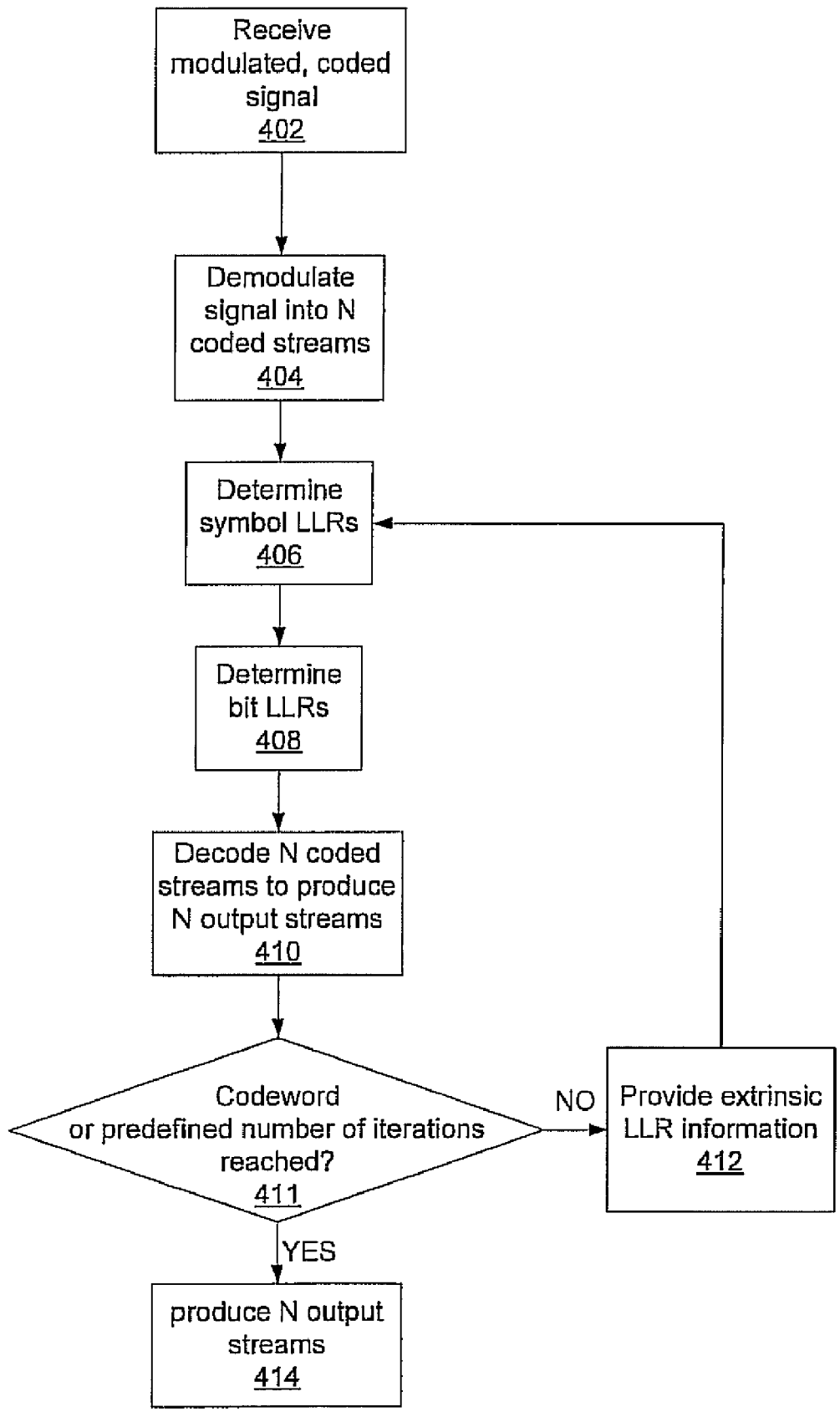
FIG. 4 shows a block/flow diagram of an exemplary method for receiving N-dimensional, LDPC-coded signals.

The aforementioned systems are further represented by FIGS. 3 and 4, providing block/flow diagrams which illustrate transmission and reception according to the present principles respectively. FIG. 3 begins at block 302 with a determination of the desired data transmission rate. Because commodity hardware is used to provide high transmission rates, the desired transmission rate will determine how many orthonormal basis functions are appropriate. N such functions are selected at block 304. As noted above, the orthonormal basis functions may include such functions as phase, time, and frequency.

N input streams are then LDPC encoded in block 306, using an appropriately structured LDPC code (e.g., quasi-cyclic). The encoded streams are bit interleaved in block 307. The interleaved stream is mapped onto the N orthonormal basis functions at block 308, and the signals are modulated onto an N-dimensional symbol constellation at block 310. These symbols are then transmitted over a communication link such as an optical fiber.

FIG. 4 shows a block/flow diagram illustrating reception according to the present principles. A modulated, coded signal is received coherently at block 402. This signal is demodulated into N coded bit streams at block 404. Symbol LLRs and bit LLRs are determined at blocks 406 and 40B respectively, informed by extrinsic LLR information. The bit streams are then LDPC decoded at block 410 to produce N output streams, as well as generating extrinsic LLR information. If the process has been performed more than a predefined number of iterations or if decoding has completed, the outputs are produced at block 414. If the process has not completely decoded the codeword and if the process has been performed fewer than a predefined number of iterations, the extrinsic LLR information is fed back at block 412 to be used in block 406. Thus the feedback of LLR information continues until all parity-check equations are satisfied, or until a predetermined number of iterations is reached.

Figure 5:
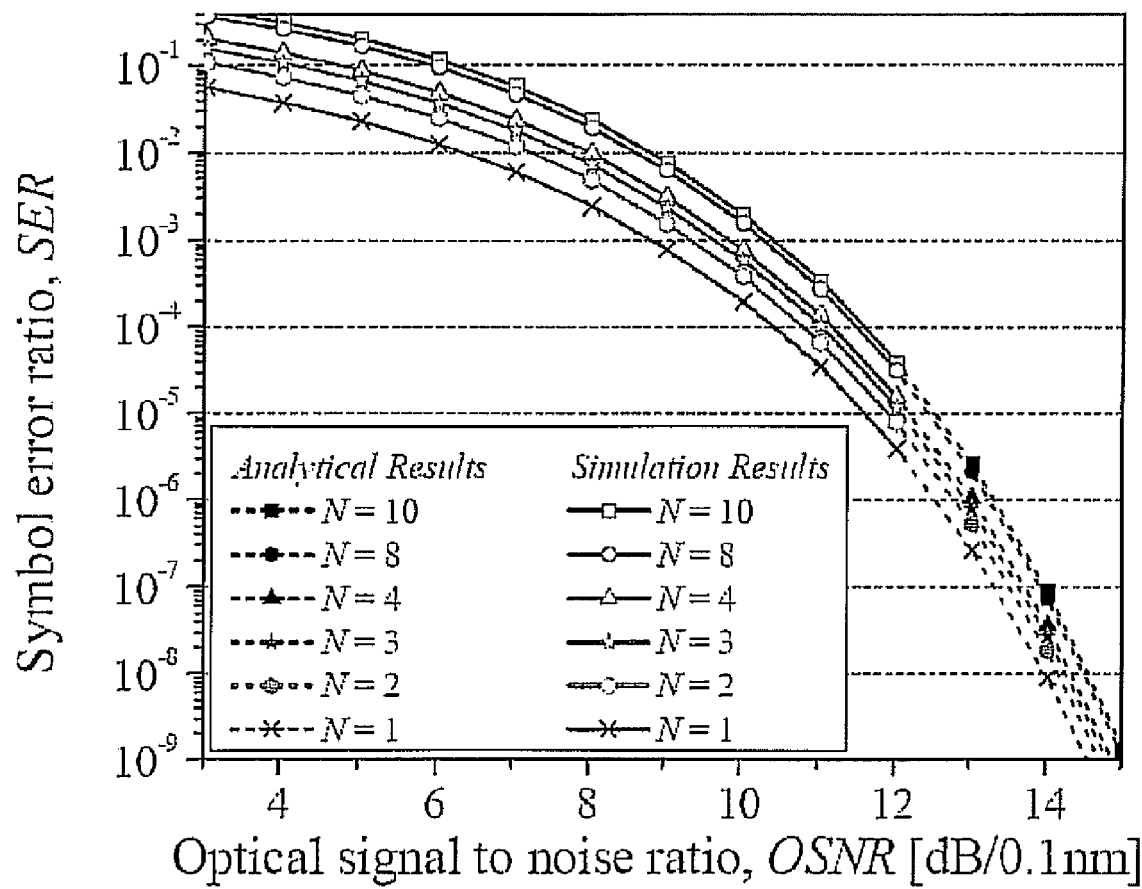
FIG. 5 graphs the simulated and analytical symbol error ratio versus signal to noise ratio curves for systems using various numbers of dimensions.

Simulations have been performed using various values for N. FIG. 5 shows a graph that depicts the symbol error ratios (SER) for variously dimensioned constellations with respect to the optical signal to noise ration. As can be seen, increasing the number of dimensions, and hence increasing the aggregate data transmission rate imposes only a moderate penalty in SER. At a SER of $10^{-10}$, increasing N from 1 to 10, thereby increasing the transmission rate by a factor of ten, hardly results in a 0.7 dB penalty. This penalty is decreased even more at lower SERs, as the curves begin to converge.

Thus, a multi-dimensional, LDPC-coded modulation scheme according to the present principles enables, for example, optical transmission beyond 400 Gb/s in aggregate rate using currently available 40 Giga Symbols/s equipment. The proposed scheme introduces significant transmission speed improvement with a negligible penalty.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A transmitter for optical transmissions comprising:
    at least one low density parity check (LDPC) encoder configured to encode source data;
    an interleaver to interleave the encoded data;
    a mapper configured to generate N coordinates, defined by a set of N orthonormal basis functions each representing a dimension, in accordance with an N-dimensional (N-D) signal constellation; and
    a modulator configured to perform electrical-to-optical conversion in accordance with each of the N coordinates to provide a transmission signal, wherein the mapper determines the corresponding M-ary signal constellation point $$s_i = \frac{1}{\sqrt{N}} \sum_{j=1}^{N} \phi_{i,j} \Phi_j(t),$$

and wherein $\phi_{i,j}$ represents the possible values of the orthonormal basis functions, $\Phi_j(t)$ represents the set of orthonormal basis functions at the given point in time, and $M=2^N$.

2. The transmitter of claim 1, wherein N is three or greater.

3. The transmitter of claim 1, wherein $\phi_{i,j} \in \{1,-1\}$ and the M signals form the vertices of an N-dimensional hypercube.

4. The transmitter of claim 1, wherein the at least one LDPC encoder uses a structured LDPC code.

5. A coherent receiver for optical transmissions, comprising:
    a demodulator configured to receive an input signal comprising N component signals, each modulated according to one of N orthonormal basis functions, and configured to output N branches corresponding to the N signals;
    a demapper configured to receive the N branches and iteratively demap the N branches based on extrinsic log likelihood ratios (LLRs);
    a bit LLR calculator configured to compute LLRs for bit prediction; and
    at least one LDPC decoder configured to iteratively decode bits by feeding back extrinsic LLRs to the demapper, wherein the mapper determines the corresponding M-ary signal constellation point $$s_i = \frac{1}{\sqrt{N}} \sum_{j=1}^{N} \phi_{i,j} \Phi_j(t),$$

and wherein $\phi_{i,j}$ represents the possible values of the orthonormal basis functions, $\Phi_j(t)$ represents the set of orthonormal basis functions at the given point in time, and $M=2^N$.

6. The receiver of claim 5, wherein N is three or greater.

7. The receiver of claim 5, wherein each LDPC decoder decodes a separate bit stream.

8. The receiver of claim 5, wherein the LDPC decoder iteratively decodes bits until either the LDPC decoder converges to a codeword or until a predefined number of iterations is reached.

9. A method for N-dimensional modulation, comprising:
    encoding a signal with a low-density parity check (LDPC) code;
    interleaving data from a plurality of encoders to a mapper;
    mapping an encoded signal to N constellation coefficients, defined by a set of N orthonormal basis functions each representing a dimension, using an N-dimensional constellation; and
    performing a modulation in accordance with the N constellation coefficients to provide a transmission signal;
    determining corresponding M-ary signal constellation point $$s_i = \frac{1}{\sqrt{N}} \sum_{j=1}^{N} \phi_{i,j} \Phi_j(t),$$

wherein $\phi_{i,j}$ represents the possible values of the orthonormal basis functions, $\Phi_j(t)$ represents the set of orthonormal basis functions at the given point in time, and $M=2^N$.

10. The method of claim 9, further comprising:
    coherently receiving the transmission signal;
    demodulating the transmission signal into N branches corresponding to the N orthonormal basis functions;
    iteratively demapping the transmission signal from the N branches using an N-dimensional signal constellation;
    predicting bits using LLRs for demapped bits; and
    iteratively decoding using at least one LDPC decoder configured to iteratively decode bits by feeding back extrinsic LLRs for demapping.

11. The method of claim 9, wherein N is three or greater.

12. The method of claim 9, wherein the LDPC code is a structured code.

13. A computer readable medium comprising a computer readable program, wherein the computer readable program when executed on a computer causes the computer to perform the method of claim 9.

* * * * *